(12) United States Patent
Horiuchi et al.

(10) Patent No.: US 9,496,156 B2
(45) Date of Patent: Nov. 15, 2016

(54) SEMICONDUCTOR CRYSTAL BODY PROCESSING METHOD AND SEMICONDUCTOR CRYSTAL BODY PROCESSING DEVICE

(75) Inventors: Hideya Horiuchi, Nagaokakyo (JP); Satoru Hachinohe, Nagaokakyo (JP); Junichi Koshino, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 697 days.

(21) Appl. No.: 13/539,711

(22) Filed: Jul. 2, 2012

(65) Prior Publication Data
US 2012/0267831 A1 Oct. 25, 2012

Related U.S. Application Data

(63) Continuation of application No. PCT/JP2011/050492, filed on Jan. 14, 2011.

(30) Foreign Application Priority Data

Jan. 20, 2010 (JP) ................................ 2010-010095

(51) Int. Cl.
*H01L 21/66* (2006.01)
*H01L 21/02* (2006.01)
*H01L 21/67* (2006.01)
*G02B 1/02* (2006.01)

(52) U.S. Cl.
CPC ........... *H01L 21/67098* (2013.01); *G02B 1/02* (2013.01); *H01L 21/67092* (2013.01); *H01L 21/67103* (2013.01)

(58) Field of Classification Search
CPC ................ G02B 1/02; H01L 21/67092; H01L 21/67103

USPC .................................. 264/430, 451; 425/143
See application file for complete search history.

(56) References Cited

U.S. PATENT DOCUMENTS 6,222,242 B1 * 4/2001 Konishi et al. ............... 257/467
2004/0244826 A1 * 12/2004 Takagi ........................... 136/239

FOREIGN PATENT DOCUMENTS

| JP | 3056604 A | 3/1991 |
| JP | 11261119 A | 9/1999 |
| JP | 2000049392 A | 2/2000 |
| JP | 2004221464 A | 8/2004 |

(Continued)

OTHER PUBLICATIONS

Written Opinion of the International Searching Authority and International Search Report, mailed Apr. 19, 2011.

*Primary Examiner* — Robert J Grun
(74) *Attorney, Agent, or Firm* — Arent Fox LLP (57) ABSTRACT

A semiconductor crystal body processing method includes providing a semiconductor crystal body, sandwiching the semiconductor crystal body between a pair of conductive pressurizing tools, applying a pulse-like current between the pair of pressurizing tools to heat the semiconductor crystal body to a target temperature equal to or higher than a temperature at which the semiconductor crystal body is plastically deformed by pressurization and lower than its melting point, and applying pressure and a pulse-like current between the pair of pressurizing tools to thereby maintain the temperature of the semiconductor crystal body at the target temperature and mold the semiconductor crystal body into a target shape by plastic deformation.

12 Claims, 5 Drawing Sheets

(56) References Cited

FOREIGN PATENT DOCUMENTS

| JP | 2005142370 A | 6/2005 |
|----|--------------|--------|
| JP | 2006237460 A | 9/2006 |

* cited by examiner

SEMICONDUCTOR CRYSTAL BODY PROCESSING METHOD AND SEMICONDUCTOR CRYSTAL BODY PROCESSING DEVICE

This is a continuation of application Serial No. PCT/JP2011/050492, filed Jan. 14, 2011, the entire contents of which are incorporated herein by reference.

TECHNICAL FIELD

The present invention relates to a semiconductor crystal body processing method, and more specifically, relates to a semiconductor crystal body processing method which can process a semiconductor crystal body at a temperature lower than the temperature in a former method.

BACKGROUND ART

Known as a processing method for plastically deforming a semiconductor crystal body (typified by a Si-based crystal body or a Ge-based crystal body) is a processing method disclosed in Patent Document 1 (Japanese Unexamined Patent Application Publication No. 2005-142370).

According to the processing method disclosed in Patent Document 1, a semiconductor crystal body, such as a Si-based crystal body or a Ge-based crystal body, is heated to a temperature equal to or higher than a temperature having a plastic deformation capacity and lower than the melting point, and then a load is applied thereto using a pressurizing tool to subject the same to rolling processing or bending processing for plastic deformation. For example, the crystal body and the pressurizing tool in the case of a Si crystal body, are heated to a temperature of 1050° C. or higher and lower than 1414° C., and then a load is applied thereto for processing. In the case of a Ge crystal body, for instance, the crystal body and the pressurizing tool are heated to a temperature of 600° C. or higher and lower than 917° C., and then a load is applied thereto for processing.

In contrast, an electric discharge sintering method for a powder material is known which includes applying a pulse-like high current under pressurization to rapidly increase the temperature of the material by a self heat generation phenomenon for sintering. For example, Patent Document 2 (Japanese Unexamined Patent Application Publication No. 3-56604) discloses a method including charging a powder material into a metallic mold containing a punch and a die, pressuring the same at a pressure of 5 to 30 T/cm², and then applying a 350 A/cm² pulse-like current at a cycle of 300 Hz to 30 kHz to rapidly increase the temperature of the material to 800 to 1000° C. by a self heat generation phenomenon for compression baking. Patent Document 2 describes that the temperature of a sintered compact can be increased to about 3000° C. in about 1 to 3 minutes, as required.

PATENT LITERATURE CITATION LIST

Patent Document 1: Japanese Unexamined Patent Application Publication No. 2005-142370
Patent Document 2: Japanese Unexamined Patent Application Publication No. 3-56604

SUMMARY OF INVENTION

Technical Problem

According to the former semiconductor crystal body processing method disclosed in Patent Document 1 described above, a semiconductor crystal body can be processed into a desired shape and this is very useful technique for developing a novel semiconductor device and manufacturing the same.

However, the semiconductor crystal body and the pressurizing tool are required to be heated to 1050 to 1414° C. in the case of a Si crystal body or 600 to 917° C. in the case of a Ge crystal body, and because the heating temperature is high, the following problems have occurred.

1) Since the method includes heating the entire semiconductor crystal body and the pressurizing tool to increase the temperature of the semiconductor crystal body, it takes time to increase/decrease the temperature, and therefore processing has required long time.
2) There has been a possibility that the semiconductor crystal body and the pressurizing tool can undergo a chemical reaction due to the high temperature.

Solution to Problem

The invention has been made in order to solve the problems of the former semiconductor crystal body processing method of Patent Document 1 described above.

More specifically, the present inventors have conducted extensive research considering whether or not the above-described technique of applying a pulse-like high current to a body to be processed under pressurization to rapidly increase the temperature of the body to be processed by a self heat generation phenomenon method disclosed in Patent Document 2 can be applied to the semiconductor crystal body processing.

As a measure for solving the problems of the conventional processing method described above, the semiconductor crystal body processing method of the invention can include preparing a semiconductor crystal body, sandwiching the semiconductor crystal body with a pair of pressurizing tools containing a material mainly containing a conductive material, applying a pulse-like current between the pair of pressurizing tools to increase the temperature of the semiconductor crystal body by self heat generation to a target temperature equal to or higher than a temperature at which the semiconductor crystal body is plastically deformed by pressurization and lower than the melting point, and applying a pressure between the pair of pressurizing tools while continuously applying the pulse-like current between the pair of pressurizing tools to thereby maintain the temperature of the semiconductor crystal body at the target temperature to mold the semiconductor crystal body into a target shape by plastic deformation.

The semiconductor crystal body processing device of the invention is constituted by a configuration suitable for carrying out the semiconductor crystal body processing method of the invention described above.

Advantageous Effects of Invention

Since the semiconductor crystal body processing method of the invention has the above-described configuration, the following effects can be demonstrated.

1) Since the method includes causing self heat generation in the semiconductor crystal body by use of a pulse-like current to rapidly increase the temperature, it does not take much time to increase/decrease the temperature, and therefore the semiconductor crystal body can be processed in a short time.

2) Since the temperature of the pressurizing tools does not become high, the semiconductor crystal body does not undergo a chemical reaction with the pressurizing tools.

BRIEF DESCRIPTION OF DRAWINGS

FIGS. 1(A) and 1(B) illustrate a semiconductor crystal body processing method according to an embodiment, in which

DESCRIPTION OF EMBODIMENTS

Hereinafter, aspects for carrying out the invention are described with reference to the drawings.

Figure 1A:
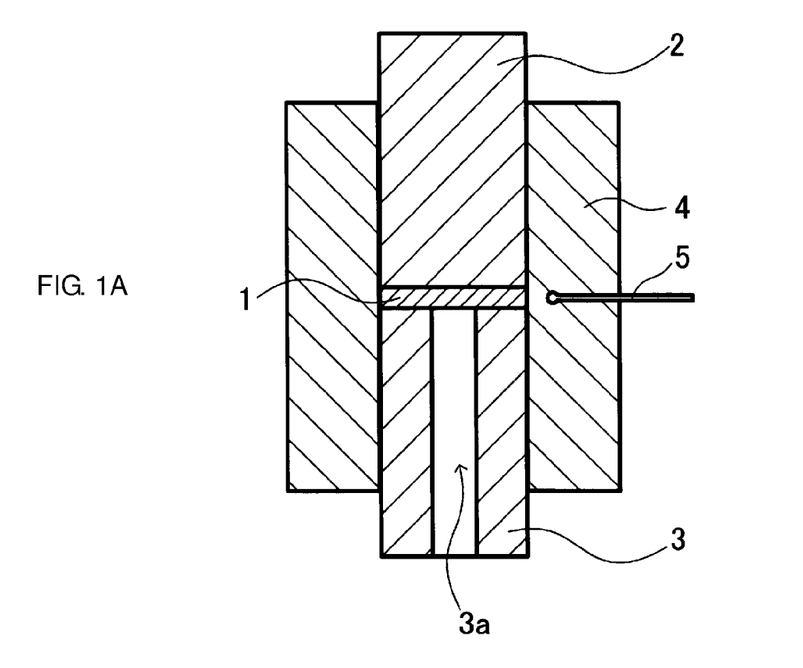
FIG. 1(A) is a cross sectional view illustrating a state before pressurization and FIG. 1(B) is a cross sectional view illustrating a state after pressurization.
Figure 1B:
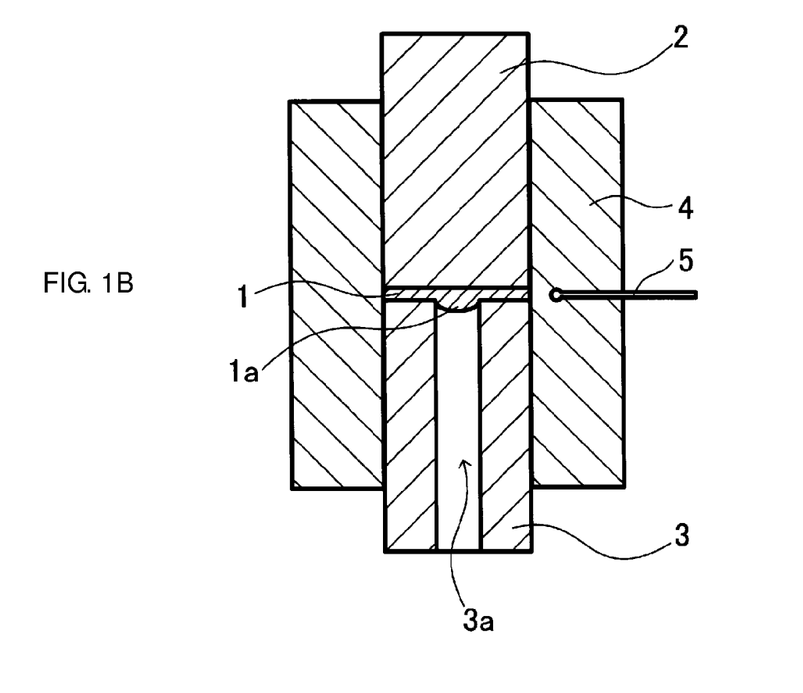

FIGS. 1(A) and 1(B) illustrate a semiconductor crystal body processing method according to an embodiment of the invention. FIG. 1(A) is a cross sectional view illustrating a state before pressurization and FIG. 1(B) is a cross sectional views illustrating a state after pressurization.

According to the semiconductor crystal body processing method of this embodiment, first, a semiconductor crystal body 1 is prepared as a workpiece. The type of the semiconductor crystal body 1 is arbitrarily determined, and a Si-based crystal body typified by a Si crystal body, a Ge-based crystal body typified by a Ge crystal body, or other semiconductor crystal bodies can be used.

An upper punch 2 and a lower punch 3 containing a conductive material are prepared as a pressurizing tool. At least one of the upper punch 2 and the lower punch 3 has an abutting surface corresponding to a desired semiconductor crystal body processing shape. In this embodiment, the lower punch 3 has a through hole 3a at the center of the abutting surface.

Next, the semiconductor crystal body 1 is sandwiched between the upper punch 2 and the lower punch 3.

A cylindrical die 4 is prepared, and then the upper punch 2 and the lower punch 3 sandwiching the semiconductor crystal body 1 are accommodated in the die 4 as illustrated in FIG. 1(A). A thermocouple is embedded as a temperature detecting element 5 in the die 4. The temperature detecting element is not limited to a thermocouple and can be selected, in addition to the thermocouple, from, for example, an IC temperature sensor utilizing the temperature characteristics of a platinum resistance thermometer bulb, a thermistor, a thermocouple, or a transistor, a quartz thermometer, an infrared-type thermopile or thermistor, a photon-type photodiode or phototransistor, and the like.

Next, a pulse-like current is applied between the upper punch 2 and the lower punch 3 while measuring the temperature by the temperature detecting element 5. Since the die 4 contacts the upper punch 2 and the lower punch 3, the applied pulse-like current flows in two courses of the upper punch 2→the semiconductor crystal body 1→and the lower punch 3 and the upper punch 2→the die 4→the lower punch 3. When a pulse-like current is applied, a self heat generation phenomenon occurs in the semiconductor crystal body 1 and the upper punch 2, the lower punch 3, and the die 4 to rapidly increase the temperature of the semiconductor crystal body 1.

The application of the pulse-like current is performed using a commonly-used pulse-like current generating device (not illustrated).

Figure 2:
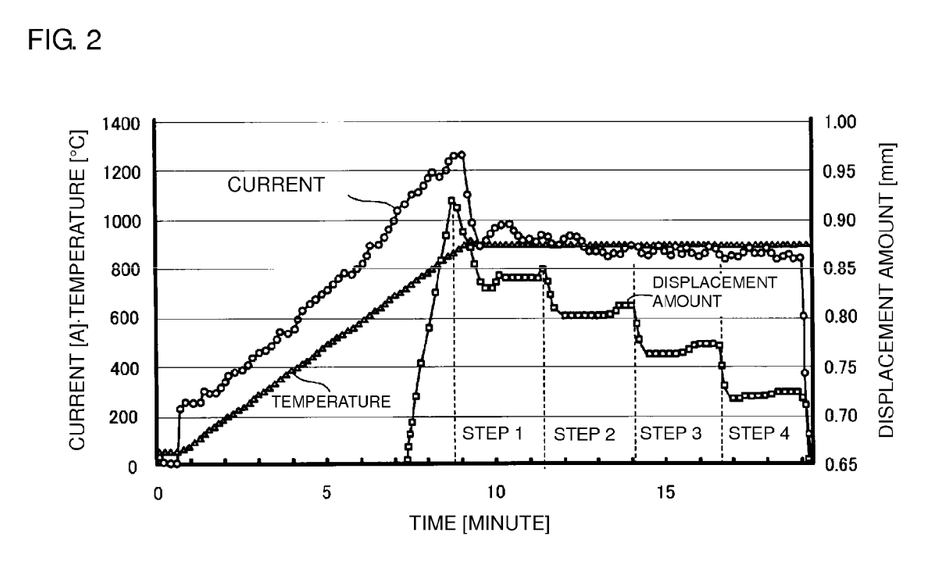
FIG. 2 is a graph illustrating changes over time of a pulse-like current [A], the temperature [° C.] of a temperature detecting element embedded in a die, and the displacement amount [mm] of an upper punch in the semiconductor crystal body processing method of Example 1.

For the temperature of the temperature detecting element 5, a target temperature is determined beforehand. FIG. 2 is a graph illustrating changes with time of the pulse-like current [A] to be applied, the temperature [° C.] of the temperature detecting element 5 embedded in the die 4, and the displacement amount [mm] of the upper punch 2 in Example 1 described later. The target temperature is a temperature at which the temperature of the temperature detecting element 5 is flat over time. In Example 1, the target temperature is set to 900° C. The displacement amount of the upper punch 2 refers to the displaced amount of the upper surface of the upper punch 2 from the position before heating based on the undersurface of the lower punch 3 and is the sum of the deformation amount by the thermal expansion of the semiconductor crystal body, the deformation amount by the thermal expansion of the lower punch 3, and the deformation amount by the thermal expansion of the upper punch 2.

The current [A] of the pulse-like current is increased until the temperature of the temperature detecting element 5 reaches the target temperature. In Example 1, the temperature of the temperature detecting element 5 reaches 900° C. of the target temperature about when the current exceeds 1250 A immediately after 9 minutes have passed from the initiation of the application of the pulse-like current. After the temperature of the temperature detecting element 5 reaches the target temperature, the current [A] of the pulse-like current is somewhat reduced, and then the pulse-like current is continuously applied while employing feedback in such a manner as to maintain the target temperature. Feedback is performed by a feedback device (not illustrated) which communicates the measurement temperature of the temperature detecting element 5 to the pulse-like current generating device.

When the pulse-like current is applied so that the temperature increases, the semiconductor crystal body 1 initiates a volume expansion. This can be confirmed from the displacement amount of the upper punch 2. In FIG. 2, the displacement amount of the punch 2 is shown when the displacement amount exceeds 0.65 mm. In actuality, the upper punch 2 initiated the displacement from when the pulse-like current is applied, so that the temperature starts to increase.

Although timing is arbitrarily determined, a pressure is applied between the upper punch 2 and the lower punch 3. More specifically, the timing for initiating the application of the pressure may be set before, when, or after the temperature of the temperature detecting element 5 reaches the target temperature. When the pressure is applied before the temperature of the temperature detecting element 5 sufficiently increases, the semiconductor crystal body 1 may break, and thus such timing is not preferable.

When pressure is applied between the upper punch 2 and the lower punch 3, the thickness of the semiconductor crystal body 1 decreases as illustrated in FIG. 1(B). Since the pressure is not applied to the through hole 3*a* portion of the lower punch 3 at the bottom surface of the semiconductor crystal body 1, a bulging portion 1*a* is formed at the through hole 3*a* portion of the lower punch 3 at the bottom surface of the semiconductor crystal body 1.

Although the pressure applied between the upper punch 2 and the lower punch 3 can also be set to a high value at once, it is preferable to gradually increase the value while observing the displacement amount of the upper punch 2 or the lower punch 3. More specifically, when a high pressure is applied at once, the semiconductor crystal body 1 may break, and thus such a pressure is not preferable. The plastic deformation amount of the semiconductor crystal body 1 can be read from the displacement amount of the upper punch 2. Therefore, when the value of the pressure is gradually increased while observing the displacement amount to gradually plastically deform Si crystal body semiconductor crystal body 1, the processing can be completed with a desired plastic deformation amount, so that the semiconductor crystal body 1 is not plastically deformed beyond necessity. Therefore, such pressure application is preferable. In Example 1, the pressure to be applied between the upper punch 2 and the lower punch 3 is gradually increased in four stages indicated as Steps 1 to 4.

When the plastic deformation amount of the semiconductor crystal body 1 reaches a desired value, the application of the pulse-like current is terminated and the application of the pressure between the upper punch 2 and the lower punch 3 is also terminated. It is confirmed whether or not the plastic deformation amount of the semiconductor crystal body 1 has reached a desired value of the displacement amount of the upper punch 2. In this stage, the application of the pressure between the upper punch 2 and the lower punch 3 may not be terminated. As described below, a pressure which does not break the semiconductor crystal body 1 (e.g., from the weight or the like of the punch) may be applied when cooling the semiconductor crystal body 1, the upper punch 2, the lower punch 3, and the die 4.

Finally, the semiconductor crystal body 1, the upper punch 2, the lower punching 3, and the die 4 are cooled, and then the semiconductor crystal body 1 is extracted from the upper punch 2, the lower punch 3, and the die 4 to thereby complete the processing of the semiconductor crystal body of this embodiment. For the cooling of the semiconductor crystal body 1, the upper punch 2, the lower punch 3, and the die 4, natural cooling may be acceptable or the semiconductor crystal body 1, the upper punch 2, the lower punch 3, and the die 4 may be cooled in an accelerated manner by a cooling device. However, the temperature of the semiconductor crystal body 1, the upper punch 2, the lower punch 3, and the die 4 increases due to a self heat generation phenomenon, mainly in the semiconductor crystal body 1, and the temperature of unnecessary portions does not increase beyond necessity. Therefore, the time required for cooling is shorter than that of a former processing method in which the pressurizing tool is heated to indirectly heat the semiconductor crystal body.

In the first embodiment, a through hole 3*a* is provided at the central portion of the lower punch 3 and the bulging portion 1*a* is formed at the bottom surface of the semiconductor crystal body 1. The semiconductor crystal body 1 can be utilized as a flat convex lens, for example.

In this embodiment, the self heat generation of the semiconductor crystal body 1 is caused by a pulse-like current to rapidly increase the temperature. Therefore, it does not take time to increase/decrease the temperature and the semiconductor crystal body can be processed in a short time. Moreover, since the temperature of the pressurizing tool (the upper punch 2 and lower punch 3) does not become high, the semiconductor crystal body 1 does not undergo a chemical reaction with the pressurizing tools. As a result, the selection degree of freedom of materials of the pressurizing tool increases, so that inexpensive materials and materials which can be easily processed can be selected. Moreover, the energy consumption amount is smaller than that of former methods.

The semiconductor crystal body processing method according to the first embodiment is described above but the invention is not limited thereto and can be variously altered in accordance with the gist of the invention.

For example, a method for controlling the temperature by the temperature detecting element 5 embedded in the die 4 in the first embodiment is not limited to this method and the temperature may be controlled by another device. The temperature can be controlled not at the outside of the semiconductor crystal body (the temperature detecting element 5 embedded in the die 4) but by the temperature of the semiconductor crystal body itself as described later. According to this method, the relationship between the temperature of the semiconductor crystal body, the pressure to be applied, and the plastic deformation amount can be more strictly grasped, and therefore the method is preferable.

Moreover, the processing shape of the semiconductor crystal body is not limited thereto and can be arbitrarily determined by changing the shape of the upper punch 2 or the lower punch 3. For example, when a through hole is not used but a dent having a desired lens shape is formed in the lower punch 3, a spherical lens having an intended radius of curvature and an aspheric surface lens can also be produced. Moreover, the pressurizing tools are not limited to the upper punch 2 and the lower punch 3, and a pressurizing tool other than the punches may be used.

Furthermore, as already described, the type of the semiconductor crystal body to be processed is arbitrarily determined and the semiconductor crystal body is not limited to the Si crystal body and other Si-based crystal bodies, Ge Si-based crystal bodies, and other semiconductor crystal bodies may be acceptable.

EXAMPLES

The following experiment was carried out according to the semiconductor crystal body processing method of the invention.

Example 1

Hereinafter, Example 1 is described with reference to FIGS. 1(A) and 1(B).

In Example 1, a square plate-like Si crystal body 1 having dimensions of a length of 14 mm, a width of 14 mm, and a thickness of 2 mm was prepared as a workpiece.

As pressurizing tools, an upper punch 2 and a lower punch 3 containing graphite, which is a conductive material, and having a cylindrical structure having a diameter of 20 mm and a height of 50 mm were prepared. Only the lower punch 3 has a through hole 3a having a diameter of 6 mm at its central portion.

As a die 4, a cylindrical die containing graphite and having an inner diameter of 20 mm, an outer diameter of 50 mm, and a height of 80 mm was prepared. A temperature detecting element 5 is embedded in the die 4. The temperature detecting element 5 is provided with a temperature measuring portion (portion represented by the white circle in the drawings) at a portion 5 mm distant from the inner wall of the cylinder portion of the die 4.

The Si crystal body 1 was sandwiched between the upper punch 2 and the lower punch 3, and the Si crystal body 1, the upper punch 2, and the lower punch 3 were entirely accommodated in the die 4.

In Example 1, the target temperature of the temperature detecting element 5 was set to 900° C., and then the application of a pulse-like current with a 300 Hz cycle between the punch 2 and the lower punch 3 was initiated. The 300 Hz cycle of the pulse-like current is an example, and the cycle can be changed as appropriate.

The graph of FIG. 2 shows changes with time of the applied pulse-like current [A], the temperature [° C.] of the temperature detecting element 5 embedded in the die 4, and the displacement amount [mm] of the upper punch 2.

The application of pressure between the upper punch 2 and the lower punch 3 was initiated from when the measurement temperature of the temperature detecting element 5 reached 900° C. immediately before 9 minutes passed from the initiation of the application of the pulse-like current. The pressure was gradually increased in four stages of Steps 1 to 4 under the observation of the displacement amount of the upper punch 2, and the maximum pressure was set to 40 MPa. The load in each step is shown in Table 1.

TABLE 1

| | Load |
|---|---|
| Step 1 | 10 MPa |
| Step 2 | 20 MPa |
| Step 3 | 30 MPa |
| Step 4 | 40 MPa |

By the application of the pressure of Step 4, the displacement amount of the upper punch 2 reached an intended displace amount and the plastic deformation amount of the Si crystal body 1 reached a desired value. Therefore, the application of the pulse-like current was terminated and the application of the pressure between the upper punch 2 and the lower punch 3 was also terminated.

After entirely cooling to room temperature, the Si crystal body 1 whose processing was completed was extracted from the upper punch 2, the lower punch 3, and the die 4. In the Si crystal body 1, the thickness had decreased to 1.8 mm and a bulging portion 1a having a height of 0.08 mm was formed at the bottom surface. The Si crystal body 1 can be utilized as a flat convex lens, for example.

In Example 1, the target temperature of the temperature detecting element 5 was set to 900° C. The target temperature is not the actual temperature of the Si crystal body 1 but a temperature set by the temperature of the temperature detecting element 5 embedded in the die 4 at the outside of the Si crystal body 1.

However, the temperature control is preferably performed not by the temperature at the outside of the semiconductor crystal body (Si crystal body) 1 but by the temperature of the semiconductor crystal body itself. More specifically, when the temperature is controlled by the temperature of the semiconductor crystal body itself, the relationship between the temperature of the semiconductor crystal body, the pressure to be applied, and the plastic deformation amount can be more strictly grasped.

The Si crystal body 1, the upper punch 2, the lower punch 3, and the die 4 of Example 1 were modeled using a finite element method to thereby obtain a temperature distribution.

Figure 3:
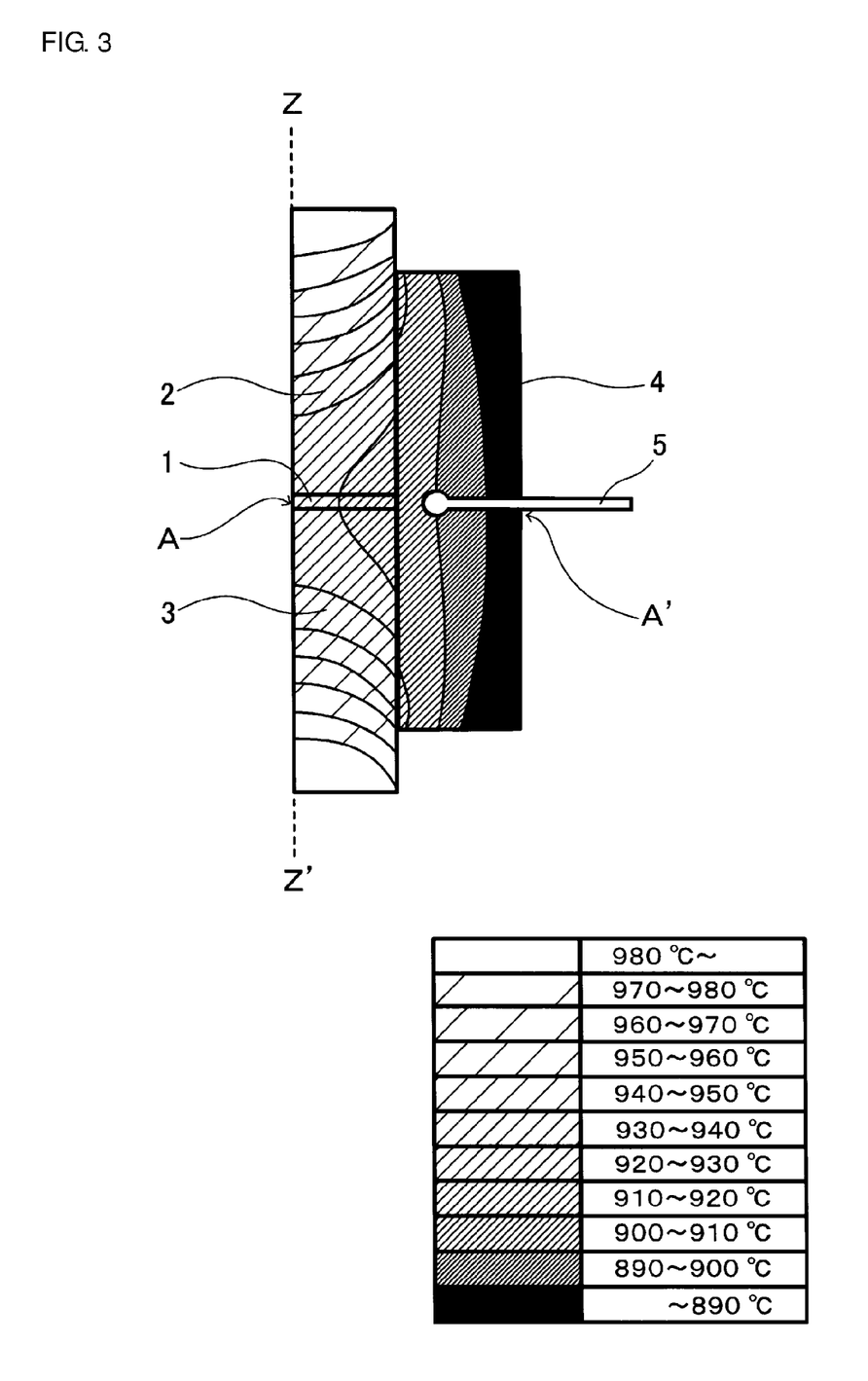
FIG. 3 shows temperature distribution obtained by a finite element method of the temperature of each of a Si crystal body portion, an upper punch portion, a lower punch portion, and a die portion when the temperature of the temperature detecting element is 900° C. in the semiconductor crystal body processing method of Example 1.
Figure 4:
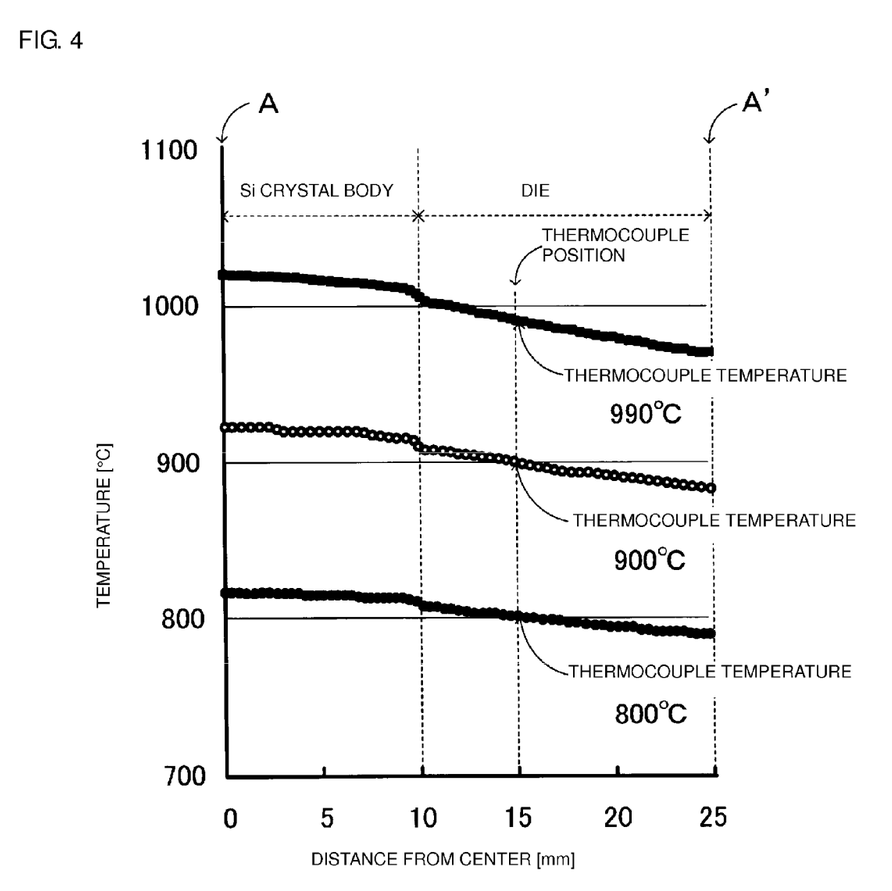
FIG. 4 is a temperature distribution view obtained by a finite element method of the temperature of a Si crystal body and a die when the temperature of the temperature detecting element is 800° C., 900° C., and 990° C. in semiconductor crystal body processing methods of Examples 1 to 3.

FIG. 3 shows the temperature distribution of each of the Si crystal body 1, the upper punch 2, the lower punch 3, and the die 4 when the temperature of the temperature detecting element 5 is 900° C. FIG. 4 shows a temperature distribution from a central portion A of the Si crystal body 1 to a peripheral portion A' of the die 4 in FIG. 3 (although three temperature distributions are illustrated in FIG. 4 at the upper portion, the central portion, and the lower portion, the temperature distribution of Example 1 in which the target temperature of the temperature detecting element 5 was set to 900° C. is illustrated at the central portion). In FIG. 3, the chain line Z-Z' represents the rotation symmetrical axis.

It was found that when the temperature of the temperature detecting element 5 is 900° C., the temperature of the central portion of the Si crystal body 1 is 922° C. and the temperature around the peripheral portion of the Si crystal body 1 is 912° C. In Example 1, although the target temperature of the temperature detecting element 5 was set to 900° C., the target temperature of the central portion of the Si crystal body 1 was set to 922° C. and the temperature around the peripheral portion of the Si crystal body 1 was set to 912° C.

Example 2

The conditions of Example 2 were the same as those of Example 1, except that the target temperature of the temperature detecting element 5 was 800° C. More specifically, the Si crystal body 1 containing the same material and having the same size was used as a semiconductor crystal body. Moreover, the same upper punch 2, the same lower punch 3, and the same die 4 were used.

Also in Example 2, the bulging portion 1a having a height of 0.07 mm was formed at the bottom surface of the Si crystal body 1 similarly as in Example 1.

In Example 2, the target temperature of the temperature detecting element 5 was set to 800° C. as described above. However, when the temperature was converted to the temperature of the Si crystal body itself by a finite element method, it was found that the temperature of the central portion was 817° C. and the temperature around the peripheral portion was 810° C. FIG. 4 shows a temperature distribution when the temperature of the temperature detecting element is 800° C. (temperature distribution shown at the lower portion in FIG. 4).

Although the target temperature of the temperature detecting element 5 was set to 800° C. in Example 2, the target temperature of the central portion of the Si crystal body 1 was set to 817° C. and the temperature around the peripheral portion of the Si crystal body 1 was set to 810° C.

A supplementary experiment in which the target temperature was set to a temperature lower than the temperature mentioned above was performed as described in Example 2 above. It was found that cracks were sometimes formed in the Si crystal body 1. Therefore, when the Si crystal body is used as the semiconductor crystal body, it is preferable to set the target temperature in processing to 810° C. or higher in terms of the temperature of the Si crystal body itself.

Example 3

The conditions of Example 3 were the same as those of Example 1, except that the target temperature of the temperature detecting element 5 was 990° C.

When the temperature is converted to the temperature of the Si crystal body itself by a finite element method, the target temperature of the central portion was set to 1020° C. and the target temperature around the peripheral portion was set to 1001° C. FIG. 4 shows a temperature distribution when the temperature of the temperature detecting element is 990° C. (temperature distribution shown at the upper portion in FIG. 4).

Also in this Example 3, the bulging portion 1a having a height of 0.09 mm was formed at the bottom surface of the Si crystal body 1.

A supplementary experiment in which the target temperature was set to a temperature higher than the temperature mentioned above was performed as in Example 3. It was found that the Si crystal body 1 melted to change the shape of the bulging portion 1a or the pressurizing tools, such as the upper punch 2 and the lower punch 3, and the Si crystal body 1 underwent a chemical reaction, so that the Si crystal body was not able to be normally processed. Therefore, when the Si crystal body is used as a semiconductor crystal body, it is preferable to set the target temperature in processing to 1020° C. or lower in terms of the temperature of the Si crystal body itself.

Example 4

In Example 4, a square plate-like Ge semiconductor crystal body 1 having a dimension of a length of 14 mm, a width of 14 mm, and a thickness of 2 mm was used as the workpiece.

As the upper punch 2, the lower punch 3, and the die 4, the same substances as those of Example 1 were used.

The pressurization to the upper punch 2 and the lower punch 3 was gradually increased in four stages of Steps 1 to 4, and the maximum pressure was set to 40 MPa.

Figure 5:
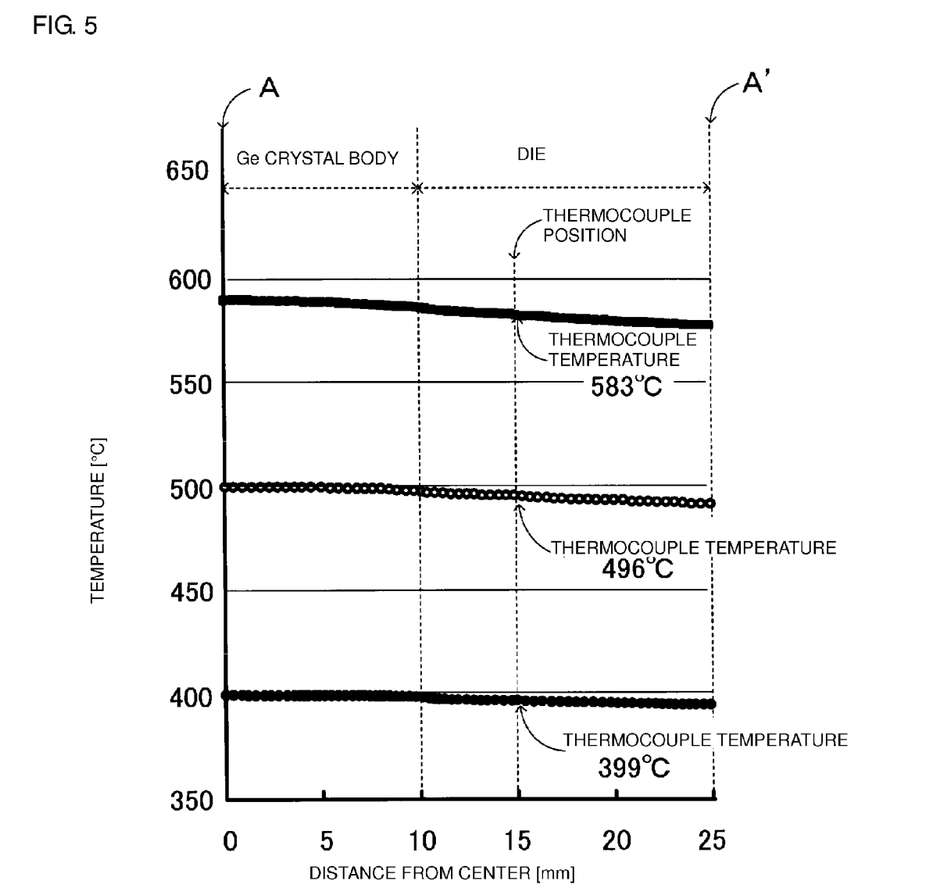
FIG. 5 shows temperature distribution obtained by a finite element method of the temperature of a Ge crystal body and a die when the temperature of a temperature detecting element is 399° C., 496° C., and 583° C. in the semiconductor crystal body processing methods of Examples 4 to 6.

In this Example 4, the target temperature of the temperature detecting element 5 was set to 496° C. When the temperature is converted to the temperature of the Ge crystal body itself by a finite element method, the target temperature of the central portion was set to 500° C. and the target temperature around the peripheral portion was set to 498° C. FIG. 5 shows temperature distributions from the central portion of the Ge crystal body 1 to the peripheral portion of the die 4 when the temperature of the temperature detecting element was 496° C. (although FIG. 5 shows three temperature distributions at the upper portion, the central portion, and the lower portion, the temperature distribution of Example 4 in which the target temperature of the temperature detecting element 5 was set to 496° C. is shown at the central portion).

Also in Example 4, the bulging portion 1a having a height of 0.125 mm was able to be formed at the bottom surface of the Ge crystal body 1.

Example 5

The conditions of Example 5 were the same as those of Example 4, except that the target temperature of the temperature detecting element 5 was 399° C.

When the target temperature of the temperature detecting element 5 (399° C.) is converted to the temperature of the Ge crystal body itself by a finite element method, the temperature of the central portion was set to 401° C. and the temperature around the peripheral portion was set to 400° C. FIG. 5 shows a temperature distribution when the temperature of the temperature detecting element is 399° C. (temperature distribution shown at the lower portion in FIG. 5).

Also in Example 5, a bulging portion 1a having a height of 0.11 mm was able to be formed at the bottom surface of the Ge crystal body 1.

A supplementary experiment in which the target temperature was set to a temperature lower than the temperature mentioned above was performed as in Example 5. It was found that cracks were sometimes formed in the Ge crystal body 1. Therefore, when the Ge crystal body is used as a semiconductor crystal body, it is preferable to set the target temperature in processing to 400° C. or higher in terms of the temperature of the Ge crystal body itself.

Example 6

The conditions of Example 6 were the same as those of Example 4, except that the target temperature of the temperature detecting element 5 was 583° C.

When the target temperature of the temperature detecting element 5 (583° C._ is converted to the temperature of the Ge crystal body itself by a finite element method, the target temperature of the central portion was set to 590° C. and the target temperature around the peripheral portion was set to 587° C. FIG. 5 shows a temperature distribution when the temperature of the temperature detecting element is 583° C. (temperature distribution shown at the upper portion in FIG. 5).

In Example 6, a bulging portion 1a having a height of 0.14 mm was able to be formed at the bottom surface of the Ge crystal body 1.

A supplementary experiment in which the target temperature was set to a temperature higher than the temperature mentioned above was performed as in Example 6. It was found that the Ge crystal body 1 melted to change the shape of the bulging portion 1a or the pressurizing tools, such as the upper punch 2 and the lower punch 3, and the Ge crystal body 1 underwent a chemical reaction, so that the Ge crystal body was not able to be normally processed. Therefore, when the Ge crystal body is used as a semiconductor crystal body, it is preferable to set the target temperature in processing to 590° C. or lower in terms of the temperature of the Ge crystal body itself.

REFERENCE SIGNS LIST

1 SEMICONDUCTOR CRYSTAL BODY (Si CRYSTAL BODY, Ge CRYSTAL BODY, etc.)
2 UPPER PUNCH (PRESSURIZING TOOL)
3 LOWER PUNCH (PRESSURIZING TOOL)
3a THROUGH HOLE
4 DIE
5 TEMPERATURE DETECTING ELEMENT (THERMOCOUPLE)

The invention claimed is:
1. A semiconductor crystal body processing method, comprising:
providing a semiconductor single crystal body between a pair of pressurizing tools comprising a conductive material, the pair of pressurizing tools defining a first shape that accommodates the semiconductor single crystal body and a second shape, applying a pulse current between the pair of pressurizing tools to thereby increase a temperature of the semiconductor single crystal body by self heat generation of the semiconductor single crystal body to a target temperature which is equal to or higher than a temperature at which the semiconductor single crystal body is plastically deformed by pressurization and lower than a melting point of the semiconductor single crystal body, and applying pressure between the pair of pressurizing tools while applying the pulse current between the pair of pressurizing tools, and increasing a magnitude of the pressure applied between the pair of pressurizing tools in discrete stages by changing a displacement amount of at least one tool the pair of pressurizing tools, to thereby maintain the temperature of the semiconductor single crystal body at the target temperature to mold the semiconductor single crystal body into the second shape by plastic deformation of the semiconductor single crystal body without the semiconductor single crystal body undergoing a chemical reaction with the pair of pressurizing tools.

2. The semiconductor crystal body processing method according to in claim 1, wherein the pair of pressurizing tools are accommodated in a die comprising a conductive material whereby the pulse current also flows in the die.

3. The semiconductor crystal body processing method according to claim 2, wherein the target temperature of the semiconductor single crystal body is maintained by controlling the pulse current in response to a temperature measured by a temperature detecting element disposed in the die or at least one of the pair of pressurizing tools.

4. The semiconductor crystal body processing method according to claim 3, wherein the magnitude of the pressure applied between the pair of pressurizing tools is increased in the discrete stages until a desired plastic deformation amount of the semiconductor single crystal body is reached.

5. The semiconductor crystal body processing method according to claim 4, wherein the semiconductor single crystal body is a Si-based crystal body and the target temperature of the semiconductor crystal body maintained when the pressure applied between the pair of pressurizing tools is 810° C. or higher and 1020° C. or lower.

6. The semiconductor crystal body processing method according to claim 4, wherein the semiconductor single crystal body is a Ge-based crystal body and the target temperature of the semiconductor single crystal body maintained when the pressure applied between the pair of pressurizing tools is 400° C. or higher and 590° C. or lower.

7. The semiconductor crystal body processing method according to claim 1, wherein the target temperature of the semiconductor single crystal body is maintained by controlling the pulse-like current in response to a temperature measured by a temperature detecting element disposed in the die or at least one of the pair of pressurizing tools.

8. The semiconductor crystal body processing method according to claim 1, wherein the semiconductor single crystal body is a Si-based crystal body and the target temperature of the semiconductor crystal body is 810° C. or higher and 1020° C. or lower.

9. The semiconductor crystal body processing method according to claim 1, wherein the semiconductor single crystal body is a Ge-based crystal body and the target temperature of the semiconductor single crystal body is 400° C. or higher and 590° C. or lower.

10. The semiconductor crystal body processing method according to claim 1, further comprising sandwiching the semiconductor single crystal body between the pair of pressurizing tools.

11. The semiconductor crystal body processing method according to claim 1, further comprising forming the semiconductor single crystal body.

12. The semiconductor crystal body processing method according to claim 4, further comprising terminating application of the pressure between the pair of pressurizing tools while applying the pulse current between the pair of pressurizing tools when the desired plastic deformation amount is reached.

* * * * *